United States Patent [19]
Choi et al.

[11] Patent Number: 5,408,135
[45] Date of Patent: Apr. 18, 1995

[54] RECTANGULAR-TO-SINE WAVE CONVERTER

[75] Inventors: Davy H. Choi, Garland; Venugopal Gopinathan, Dallas, both of Tex.

[73] Assignee: Texas Instruments Incorporated, Dallas, Tex.

[21] Appl. No.: 186,740

[22] Filed: Jan. 25, 1994

[51] Int. Cl.[6] ............ H03K 5/00; H03K 5/13; H03L 7/00; H03B 19/00
[52] U.S. Cl. ................... 327/129; 327/552; 327/257; 327/114; 327/317
[58] Field of Search ........... 328/13, 22, 27, 180, 328/167, 165, 178; 307/261, 264, 540, 542, 271, 269, 272.1

[56] References Cited

U.S. PATENT DOCUMENTS

| | | | |
|---|---|---|---|
| 3,649,923 | 3/1972 | Venturini | 307/261 |
| 3,671,871 | 6/1972 | Malm | 328/22 |
| 3,982,189 | 9/1976 | Brooks et al. | 328/22 |
| 4,250,455 | 2/1981 | Davis | 307/261 |
| 5,121,069 | 6/1992 | Burns et al. | 307/261 |

OTHER PUBLICATIONS

Declaration of Kerry Glover of Texas Instruments Incorporated dated Feb. 16, 1994.

*Primary Examiner*—Timothy P. Callahan
*Assistant Examiner*—Trong Phan
*Attorney, Agent, or Firm*—W. James Brady, III; Richard L. Donaldson

[57] ABSTRACT

A rectangular-to-sine wave converter circuit (10) is provided that comprises a flip-flop (12) that provides for a square wave and an inverse square wave circuit with fifty percent duty cycles. Each of the square wave signals is passed through a multi-stage low pass filter. The stages of the low pass filters are separated by buffers (26) and (32). The common mode voltage of the output signals at output nodes (40) and (44) are adjusted with respect to an arbitrary bias voltage $V_{bias}$ by using bias resistors (42) and (68).

13 Claims, 1 Drawing Sheet

RECTANGULAR-TO-SINE WAVE CONVERTER

TECHNICAL FIELD OF THE INVENTION

This invention relates in general to the field of electronic systems and more particularly to an improved rectangular-to-sine wave converter.

BACKGROUND OF THE INVENTION

In integrated digital systems, square wave signals are abundant. However, when a particular system or function requires a sine wave, the sine wave must be generated within the integrated system. For a variety of applications, it is sometimes important for the resultant sine wave to have a fifty percent duty cycle. In most integrated digital systems, there is no guarantee that the available square wave signals will have fifty percent duty cycles.

In addition, the sine wave signals are often used in applications that require peak-to-peak voltage swings smaller than the typically large voltage swings associated with digital signals. The voltage swings of the converted sine signal must be attenuated while maintaining the required duty cycle and without increasing the total harmonic distortion of the resultant signal.

SUMMARY OF THE INVENTION

Therefore, a need has arisen for a rectangular-to-sine wave converter circuit which outputs a differential sine wave with a fifty percent duty cycle and low total harmonic distortion.

In accordance with the teachings of the present invention, such a circuit is provided that substantially reduces or eliminates disadvantages and problems associated with prior conversion methods and systems.

According to one embodiment of the present invention, a circuit is provided that comprises a flip-flop operable to receive a rectangular signal having an indeterminate duty cycle and a constant period and operable to output a first square wave signal and an inverse square wave signal. The circuit further comprises a first multi-stage low pass filter circuit having a plurality of low pass filter stages coupled in series and operable to receive the square wave signal from the flip-flop. The circuit further comprises a second multi-stage low pass filter comprising a plurality of stages coupled in series and operable to receive the inverse square wave signal from the flip-flop. The plurality of stages of the first and second multi-stage low pass filter circuits are decoupled by placing buffer circuits between the plurality of stages. The first multi-stage low pass filter is operable to output a first sinusoidal signal having a fifty percent duty cycle and the second multi-stage low pass filter is operable to output an inverse sinusoidal signal having a fifty percent duty cycle.

BRIEF DESCRIPTION OF THE DRAWINGS

For a more complete understanding of the present invention and the advantages thereof, reference is now made to the following description taken in conjunction with the accompanying drawing wherein.

DETAILED DESCRIPTION OF THE INVENTION

Figure 1:
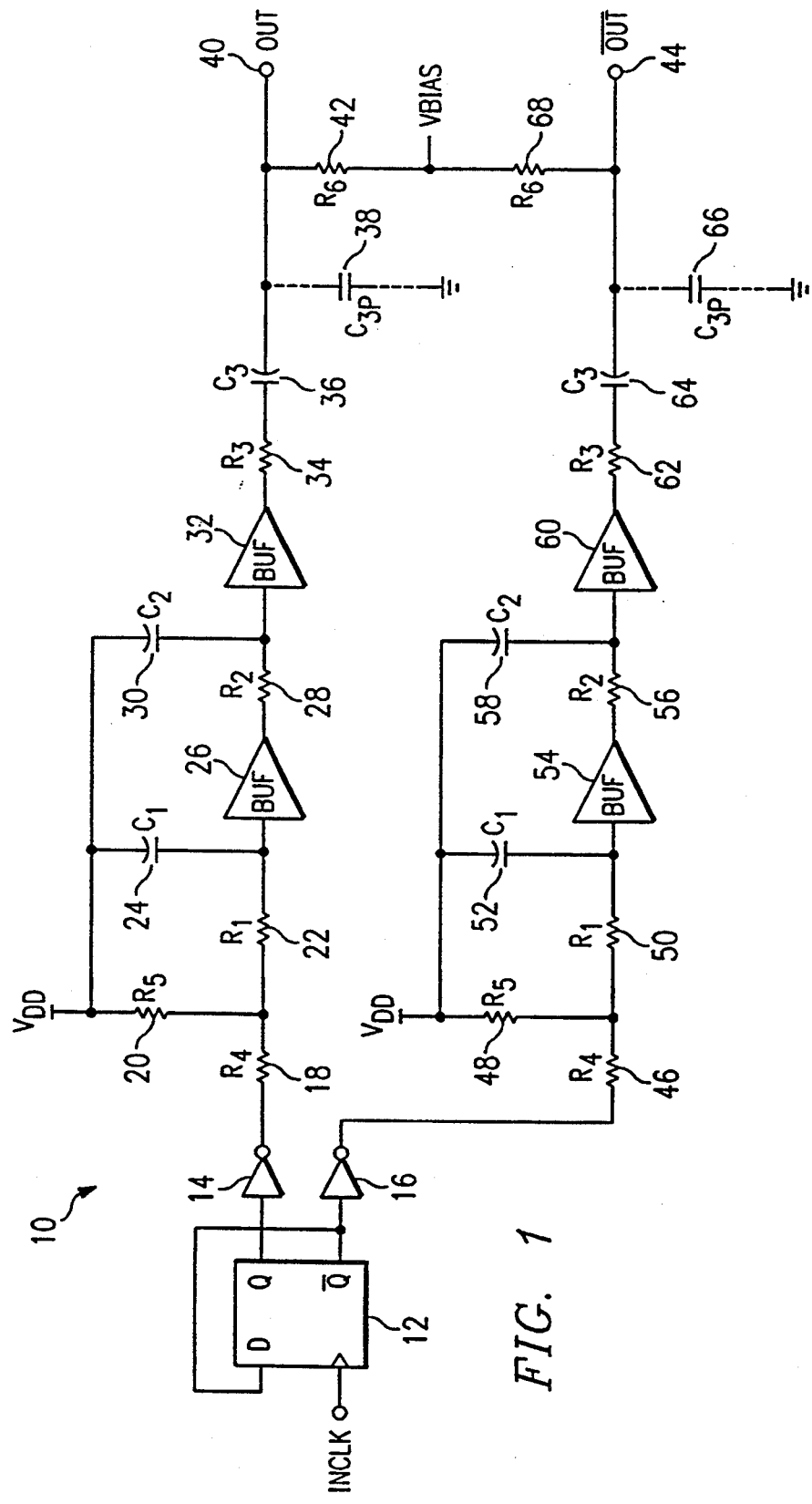
FIG. 1 is a schematic illustration of the rectangular-to-sine wave converter circuit constructed according to the teachings of the present invention.

Referring to FIG. 1, a rectangular-to-sine wave converter circuit indicated generally at 10 is shown which is constructed according to the teachings of the present invention. Circuit 10 comprises a flip-flop 12 which is operable to receive an input clock signal INCLK. The INCLK signal comprises a square wave signal having a peak-to-peak voltage on the order of 5 volts. The INCLK signal comprises a typical logic level square wave signal having an indeterminate duty cycle but a constant period. The D input of the flip-flop 12 is coupled to the $\overline{Q}$ output. In this configuration, the flip-flop 12 operates to divide the period of the INCLK signal by two and output two square wave signals having fifty percent duty cycles. The Q output is used to output the first of the two square wave signals to a first inverter 14. The inverse of the signal output by the Q output is output through the $\overline{Q}$ output to a second inverter 16.

In general, circuit 10 provides differential output by receiving inverse square wave signals and passing the inverse square wave signals through identical multi-stage low pass filter circuits. The output of inverter 14 is input into a voltage divider comprised of a resistor 18 and a resistor 20 coupled in series between the output of inverter 14 and a $V_{DD}$ supply voltage. Resistor 18 and resistor 20 operate as a voltage divider to attenuate the square wave signal from the 5 volt peak-to-peak voltage level to any desired lesser peak-to-peak voltage level. The output of the voltage divider formed by resistors 18 and 20 is input into a first stage low pass filter comprised of a resistor 22 and a capacitor 24. One node of resistor 22 is coupled to the node between resistor 18 and resistor 20 as shown in FIG. 1. The second node of resistor 22 is coupled to a first node of capacitor 24. The second node of capacitor 24 is coupled to the $V_{DD}$ supply voltage. The low pass filter formed by resistor 22 and capacitor 24 has a pole given by the equation $$\frac{1}{2\pi R_{comp} C_1} \qquad (1)$$

$$R_{comp} = R_1 + \frac{R_4 R_5}{(R_4 + R_5)} ;$$

$C_1$ is the capacitance of capacitor 24,
$R_1$ is the resistance of resistor 22,
$R_4$ is the resistance of resistor 18, and
$R_5$ is the resistance of resistor 20.

The low pass filter comprised of resistor 22 and capacitor 24 outputs a filtered signal to a buffer 26 which serves to decouple the first stage low pass filter from successive filter stages. Buffer 26 comprises a simple NMOS source follower amplifier. NMOS transistors are used in the buffers of circuit 10 due to their higher speed. An NMOS source follower configuration of an amplifier will drop the voltage signal level by an amount of voltage equal to the gate source voltage of the N channel transistor within the buffer that receives the input signal. In conventional buffers, a PMOS device is used to reestablish the input voltage level. However, the incorporation of PMOS devices within the buffer structure greatly slows the operation of the circuit as a whole and increases the transistor count of the buffer. Accordingly, the low pass filter stages within the circuit of the present invention are all referenced to the V$_{DD}$ supply voltage. Accordingly, the voltage drops within the buffers interposed between the stages of the multi-stage low pass filter are not a problem because the voltage of the input signal can be adjusted with respect to the V$_{DD}$ supply voltage in the initial voltage divider formed by resistors 18 and 20 discussed previously. As such, the voltage level of the input signal to the low pass filter can be adjusted so that the voltage drops within the buffer circuits bring the voltage to the desired output voltage level.

The output of buffer 26 is input to a second low pass filter stage formed by a series connection of a resistor 28 and a capacitor 30. Resistor 28 and capacitor 30 are coupled in series between the output of buffer 26 and the supply voltage V$_{DD}$ with the resistor 28 coupled directly to the buffer 26. The pole associated with the low pass filter stage formed by resistor 28 and capacitor 30 is given by the equation $$\frac{1}{2\pi R_2 C_2} \quad (2)$$

where

R$_2$ is the resistance of resistor 28 and
C$_2$ is the capacitance of capacitor 30.

The output of the low pass filter formed by resistor 28 and capacitor 30 is output from the node between resistor 28 and 32 to the input of a buffer 32. Buffer 32 is constructed identically to buffer 26 discussed previously. The output of buffer 32 is coupled to a final low pass filter stage formed by a resistor 34, a capacitor 36 and a parasitic capacitance 38. The resistor 34 and the capacitor 36 are coupled in series between the output of buffer 32 and an output node 40 with the resistor 34 coupled directly to the output of buffer 32. The parasitic capacitance 38 occurs between the output node 40 and ground potential. A biasing resistor 42 is coupled between the output node 40 and a DC biasing voltage V$_{bias}$. Resistor 42 and the DC biasing voltage V$_{bias}$ serve to adjust the common mode voltage of the output sinusoid signal available at output node 40.

Capacitor 36 is a capacitor formed by a layer of polycrystalline silicon disposed adjacent and insulated from a region of N+ doped semiconductor substrate. The parasitic capacitance 38 results from the capacitance from the N+ region and the backplane of the semiconductor substrate which serves to channel ground potential throughout the integrated device. The capacitance of parasitic capacitance 38 is typically expressed as a fraction of the capacitance of capacitor 36 and is given by the equation $$C_{3p} = p \times C_3 \quad (3)$$

where

C$_3$ is the capacitance of capacitor 36,
C$_{3p}$ is the parasitic capacitance associated with parasitic capacitor 38 and
p is a constant associated with the process configuration of capacitor 36 and is less than 1.

A typical value of p would be equal to 0.3. If the resistance of resistor 34 is much less than the resistance associated with resistor 42, then the pole associated with the low pass filter formed by resistor 34, capacitor 36, capacitance 38 and resistor 42 is given by the expression $$\frac{1}{2\pi \frac{p}{(1+p)} R_3 C_3} \quad (4)$$

where p is the constant described previously associated with the parasitic capacitance 38,
R$_3$ is the resistance of resistor 34 and
C$_3$ is the capacitance of capacitor 36.

In order to provide for an efficient sinusoid conversion and with a minimum of harmonic distortion, the values for the three poles given by the previous expression should be closely matched. The component values can be adjusted depending upon the frequency of the input signal and the desired harmonic distortion of the output sinusoid. Further, as discussed previously, the peak-to-peak voltage of the output sinusoid can be adjusted by adjusting the values of the resistances of resistors 18 and 20 that form the input voltage divider. An inverse sinusoid signal of the differential output is provided in output node 44. The signal provided at output node 44 is generated by passing the signal output from inverter 16 through a circuit which is identical in every respect to the three-stage low pass filter circuit described previously.

As shown in FIG. 1, the inverse square wave signal is received from the output of inverter 16 into a resistor 46 which is identical to resistor 18. Resistor 46 and a resistor 48 comprise a voltage divider which operates as discussed previously with reference to resistors 18 and resistor 20. Resistor 48 is identical to resistor 20. The output of the voltage divider is input into a first low pass filter which comprises a resistor 50 and a capacitor 52. Resistor 50 is identical to resistor 22 and capacitor 52 is identical to capacitor 24 and operate in the same manner as attributed to those components. The output of the first stage low pass filter is input into a buffer 54 which is identical to buffer 26 described previously. The output of buffer 54 is input into a second stage of a low pass filter which is comprised of a resistor 56 and a capacitor 58 and these components function identically to low pass filter formed by resistors 28 and capacitor 30 as described previously. The node between resistor 56 and capacitor 58 is coupled to the input of a buffer 60 which is identical to buffer 32 described previously. The output of buffer 60 is coupled to one node of a resistor 62 which is identical to resistor 34 described previously. The second node of resistor 62 is coupled to a capacitor 64 which is identical to capacitor 36 described previously. Capacitor 64 has a parasitic capacitance 66 associated with it which is identical to parasitic capacitance 38. A second bias resistor 68 is coupled between the inverse output 44 and the bias voltage V$_{bias}$. The bias resistors 42 and 68 allow for the adjustment of the common mode voltage of the differential sinusoid output signals through the adjustment of the bias voltage V$_{bias}$.

An important technical advantage of the circuit of the present invention inheres in the fact that it provides for a sine wave output with a fifty percent duty cycle. The use of a flip-flop provides for an exact fifty percent duty cycle due to the divide-by-2 operation of the flip-flop 12. In addition, the flip-flop 12 provides for differential output signals with a single input signal.

An additional technical advantage of the present invention inheres in the fact that the use of a voltage divider allows for the attenuation of the amplitude of the input signal to any desired output level. In addition, the output sine wave exhibits less than ten percent total harmonic distortion and the use of biasing resistors allows for the adjustment of the common mode voltage of the output signal referenced to an arbitrary voltage $V_{bias}$.

Although the present invention has been described in detail, it should be understood that various changes, alterations and substitutions may be made to the teachings herein without departing from the spirit and scope of the present invention which is solely defined by the appended claims.

What is claimed is:

1. A rectangular-to-sine wave converter circuit operable to receive a rectangular input signal having an indeterminate duty cycle and a substantially constant period and to output a substantially sinusoidal signal, comprising:
   a flip-flop circuit operable to receive the rectangular input signal and to output a rectangular output signal having a fifty percent duty cycle and a period substantially equal to twice the period of the rectangular input signal;
   a voltage divider circuit operable to receive the rectangular signal from the flip-flop circuit and to attenuate the amplitude of the rectangular output signal; and
   a multistage low pass filter operable to receive the rectangular output signal and to generate and output the substantially sinusoidal output signal, the multistage low pass filter comprising at least two low pass filter stages separated by a buffer circuit.

2. The circuit of claim 1 wherein the multistage low pass filter comprises:
   a first stage low pass filter operable to receive the attenuated rectangular signal from the voltage divider circuit and operable to output a first filtered signal;
   a first buffer circuit coupled to the first low pass filter circuit and operable to receive the first filtered signal and to output a first buffered signal;
   a second low pass filter circuit coupled to the output of the first buffer circuit and operable to receive the first buffered signal and to output a second filtered signal;
   a second buffer circuit coupled to the output of the second low pass filter and operable to receive the second filtered signal and to output a second buffered signal; and
   a third low pass filter coupled to the output of the second buffer circuit and operable to receive the second buffered signal and to output the substantially sinusoidal output signal.

3. The circuit of claim 1 wherein the flip-flop circuit comprises a noninverting output operable to output the rectangular output signal and an inverting output operable to generate a complementary rectangular output signal comprising the inverse of the rectangular output signal and wherein the multistage low pass filter comprises a first multistage low pass filter coupled to the noninverting output of the flip-flop circuit, the circuit further comprising:
   a second multistage low pass filter coupled to the inverting output of the flip-flop circuit and operable to receive the complementary rectangular output signal and to generate and output a complementary substantially sinusoidal output signal comprising the inverse of the substantially sinusoidal output signal output by the first multistage low pass filter, the second multistage low pass filter comprising at least two low pass filter stages separated by a buffer circuit.

4. The circuit of claim 3 wherein the second multistage low pass filter comprises circuits which are duplicates of the circuits comprising the first multistage low pass filter.

5. The circuit of claim 3 and further comprising:
   a first-resistor coupled between the output of the first multistage low pass filter and a DC bias voltage; and
   a second resistor coupled between the output of the second multistage low pass filter and the DC bias voltage.

6. A rectangular-to-sine wave converter circuit operable to receive a rectangular input signal having an indeterminate duty cycle and a substantially constant period and to output a pair of complementary, substantially sinusoidal signals, the converter circuit comprising:
   a flip-flop circuit operable to receive the rectangular input signal and to output a noninverted rectangular output signal and an inverted rectangular output signal each having a fifty percent duty cycle and a period substantially equal to twice the period of the rectangular input signal;
   a first voltage divider circuit operable to receive the noninverted rectangular signal from the flip-flop circuit and to attenuate the amplitude of the noninverted rectangular output signal;
   a second voltage divider circuit operable to receive the inverted rectangular signal from the flip-flop circuit and to attenuate the amplitude of the inverted rectangular output signal;
   a first multistage low pass filter operable to receive the noninverted rectangular output signal and to generate and output a first substantially sinusoidal output signal, the first multistage low pass filter comprising at least two low pass filter stages separated by a buffer circuit; and
   a second multistage low pass filter operable to receive the inverted rectangular output signal and to generate and output a second substantially sinusoidal output signal, the second multistage low pass filter comprising at least two low pass filter stages separated by a buffer circuit.

7. The circuit of claim 6 wherein the first and second multistage low pass filters both comprise:
   a first stage low pass filter operable to receive the attenuated rectangular signal from the voltage divider circuit and operable to output a first filtered signal;
   a first buffer circuit coupled to the first low pass filter circuit and operable to receive the first filtered signal and to output a first buffered signal;
   a second low pass filter circuit coupled to the output of the first buffer circuit and operable to receive the first buffered signal and to output a second filtered signal;
   a second buffer circuit coupled to the output of the second low pass filter and operable to receive the second filtered signal and to output a second buffered signal; and
   a third low pass filter coupled to the output of the second buffer circuit and operable to receive the second buffered signal and to output the substantially sinusoidal output signal.

8. The circuit of claim 6 and further comprising:
a first resistor coupled between the output of the first multistage low pass filter and a DC bias voltage; and
a second resistor coupled between the output of the second multistage low pass filter and the DC bias voltage.

9. A method of converting a rectangular input signal having an indeterminate duty cycle and a substantially constant period to a substantially sinusoidal output signal, comprising the steps of:
receiving the rectangular input signal in a flip-flop circuit;
outputting a rectangular output signal from the flip-flop circuit having a fifty percent duty cycle and a period substantially equal to twice the period of the rectangular input signal;
attenuating the amplitude of the rectangular output signal in a voltage divider circuit operable to receive the rectangular signal from the flip-flop circuit; and
filtering the rectangular output signal in a multistage low pass filter operable to receive the rectangular output signal and to generate and output the substantially sinusoidal output signal, the multistage low pass filter comprising at least two low pass filter stages separated by a buffer circuit.

10. The method of claim 9 wherein the step of filtering comprises the steps of:
filtering the attenuated rectangular signal in a first stage low pass filter operable to receive the attenuated rectangular signal from the voltage divider circuit and operable to output a first filtered signal;
receiving the first filtered signal in a first buffer circuit coupled to the first low pass filter circuit and operable to output a first buffered signal;
filtering the first buffered signal in a second low pass filter circuit coupled to the output of the first buffer circuit and operable to receive the first buffered signal and to output a second filtered signal;
receiving the second filtered signal in a second buffer circuit coupled to the second low pass filter circuit and operable to output a second buffered signal; and
filtering the second buffered signal in a third low pass filter circuit coupled to the output of the second buffer circuit and operable to receive the second buffered signal and to output a third filtered signal.

11. The method of claim 9 wherein the flip-flop circuit comprises a noninverting output operable to output the rectangular output signal and an inverting output operable to generate a complementary rectangular output signal comprising the inverse of the rectangular output signal and wherein the multistage low pass filter comprises a first multistage low pass filter coupled to the noninverting output of the flip-flop circuit, the method further comprising the steps of:
filtering the complementary rectangular output signal in a second multistage low pass filter coupled to the inverting output of the flip-flop circuit and operable to receive the complementary rectangular output signal and to generate and output a complementary substantially sinusoidal output signal comprising the inverse of the substantially sinusoidal output signal output by the first multistage low pass filter, the second multistage low pass filter comprising at least two low pass filter stages separated by a buffer circuit.

12. The method of claim 11 wherein the steps of filtering in a second multistage low pass filter comprises the steps of filtering in a multistage low pass filter that comprises circuits which are duplicates of the circuits comprising the first multistage low pass filter.

13. The method of claim 11 and further comprising the steps of:
biasing the substantially sinusoid output signal by coupling a first resistor between the output of the first multistage low pass filter and a DC bias voltage; and
biasing the complementary substantially sinusoid output signal by coupling a second resistor between the output of the second multistage low pass filter and the DC bias voltage.

* * * * *